United States Patent
Kim et al.

(10) Patent No.: US 9,678,255 B2
(45) Date of Patent: Jun. 13, 2017

(54) LIGHT-TRANSMISSIVE DISPLAY APPARATUS

(71) Applicant: Samsung Display Co., Ltd., Yongin, Gyeonggi-Do (KR)

(72) Inventors: Hyunho Kim, Yongin (KR); Sooyoun Kim, Yongin (KR)

(73) Assignee: Samsung Display Co., Ltd. (KR)

( * ) Notice: Subject to any disclaimer, the term of this patent is extended or adjusted under 35 U.S.C. 154(b) by 86 days.

(21) Appl. No.: 14/734,977

(22) Filed: Jun. 9, 2015

(65) Prior Publication Data
US 2016/0146988 A1      May 26, 2016

(30) Foreign Application Priority Data
Nov. 26, 2014   (KR) .................. 10-2014-0166620

(51) Int. Cl.
| | | |
|---|---|---|
| *G02F 1/1335* | (2006.01) | |
| *G02B 5/20* | (2006.01) | |
| *G02B 5/23* | (2006.01) | |
| *H01L 51/52* | (2006.01) | |
| *H01L 27/32* | (2006.01) | |

(52) U.S. Cl.
CPC ............ *G02B 5/208* (2013.01); *G02B 5/201* (2013.01); *G02B 5/23* (2013.01); *G02F 1/133514* (2013.01); *G02F 1/133617* (2013.01); *H01L 27/322* (2013.01); *H01L 27/3246* (2013.01); *H01L 51/5284* (2013.01); *H01L 2251/5323* (2013.01)

(58) Field of Classification Search
None
See application file for complete search history.

(56) References Cited

U.S. PATENT DOCUMENTS

| | | | |
|---|---|---|---|
| 2010/0002175 A1 | 1/2010 | Kim et al. | |
| 2012/0154711 A1* | 6/2012 | Park ................... | G02B 6/0023 349/62 |
| 2013/0188103 A1* | 7/2013 | Jeng ...................... | G06F 3/041 349/12 |
| 2013/0208201 A1* | 8/2013 | Satoh ................... | G02F 1/1334 349/33 |

FOREIGN PATENT DOCUMENTS

| | | |
|---|---|---|
| JP | 11-167098 | 6/1999 |
| KR | 10-2005-0116420 A | 12/2005 |
| KR | 10-2007-0080277 A | 8/2007 |
| KR | 10-2010-0004031 A | 1/2010 |
| KR | 10-2013-0127109 A | 11/2013 |
| KR | 10-2014-0073754 A | 6/2014 |

* cited by examiner

*Primary Examiner* — Richard Kim
(74) *Attorney, Agent, or Firm* — Innovation Counsel LLP

(57) ABSTRACT

A display apparatus with improved light-transmitting property in transparent mode is presented. The apparatus includes a substrate, a plurality of display devices disposed on the substrate, and color filters, wherein the plurality of display devices are interposed between the color filters and the substrate, the color filters transmitting visible rays of a predefined wavelength band only when ultraviolet (UV) rays are received, and transmitting visible rays when no UV rays are received.

11 Claims, 2 Drawing Sheets

LIGHT-TRANSMISSIVE DISPLAY APPARATUS

RELATED APPLICATION

This application claims the benefit of Korean Patent Application No. 10-2014-0166620 filed on Nov. 26, 2014 in the Korean Intellectual Property Office, the disclosure of which is incorporated herein in its entirety by reference.

BACKGROUND

1. Field

One or more exemplary embodiments relate to a display apparatus, and more particularly, to a display apparatus with an improved light-transmitting property in a transparent mode.

2. Description of the Related Art

Display apparatuses are being used in various environments due to the recent increase in the use of mobile devices. Sometimes, a display apparatus mounted on a mobile device may have a light-transmitting property so that a user may see what is physically behind the display apparatus through the display apparatus.

However, light-transmitting display apparatuses of the related art may have problems. For example, when a user is observing the physical area behind a display apparatus through the display apparatus, visibility may be poor due to a low light-transmitting rate or visibility of an image may be poor when the image is displayed on the display apparatus. According to the exemplary embodiments of the present inventive concept, a display apparatus has an improved light-transmitting property in a transparent mode in order to solve the above problems. However, the scope of the exemplary embodiments of the present inventive concept is not limited thereto.

SUMMARY

According to one or more exemplary embodiments, a display apparatus includes a substrate; a plurality of display devices disposed on the substrate; and color filters, wherein the plurality of display devices are interposed between the color filters and the substrate, the color filters transmitting only visible rays in a predefined wavelength band only when ultraviolet (UV) rays are received, and transmitting visible rays when no UV rays are received.

The display apparatus may further include a back light unit that irradiates the plurality of display devices with UV rays.

The back light unit may simultaneously generate UV rays and visible rays and irradiates the plurality of display devices through the substrate.

The back light unit may have a light-transmitting property.

The display apparatus may further include a UV ray blocking layer, wherein the color filters are interposed between the UV ray blocking layer and the plurality of display devices.

The display apparatus may further include a contrast increasing layer that is disposed where neighboring ones of the color filters meet, wherein the contrast increasing layer transmits a first amount of light only when UV rays are received, and transmits a second amount of light when no UV rays are received, the second amount being greater than the first amount. The contrast increasing layer may be black when UV rays are irradiated.

The plurality of display devices may include liquid crystal molecules.

The plurality of display devices may include organic light-emitting devices (OLEDs). Each of the OLEDs may include a pixel electrode, a pixel defining layer that covers an edge of the pixel electrode such that a central portion of the pixel electrode is exposed, an intermediate layer that includes an emission layer and is disposed on the pixel electrode, and an opposite electrode disposed on the intermediate layer. The pixel defining layer may have a low light-transmission rate only when UV rays are irradiated and a light-transmitting property when no UV rays are irradiated.

The pixel defining layer may transmit substantially no light while receiving UV rays.

The OLEDs may simultaneously emit UV rays and visible rays.

BRIEF DESCRIPTION OF THE DRAWINGS

These and/or other aspects will become apparent and more readily appreciated from the following description of the exemplary embodiments, taken in conjunction with the accompanying drawings in which.

DETAILED DESCRIPTION

Figure 1:
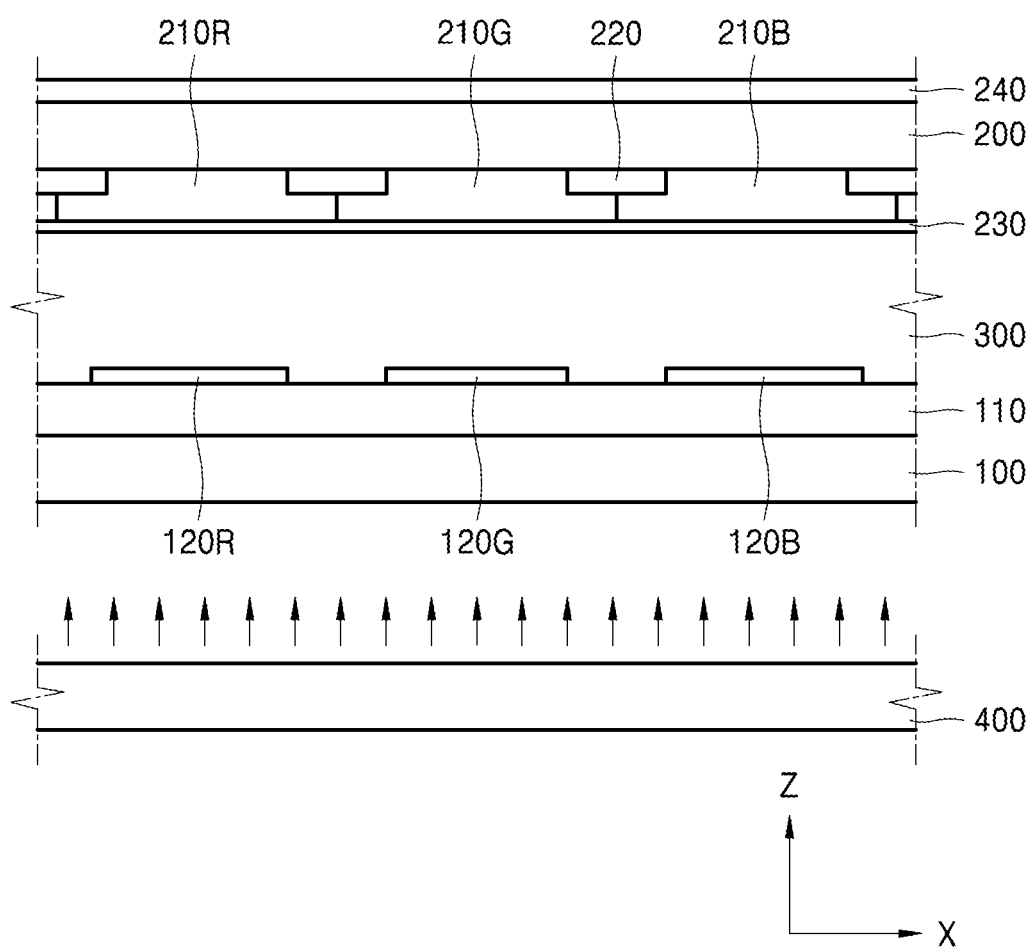
FIG. 1 is a cross-sectional view schematically illustrating a portion of a display apparatus according to an exemplary embodiment.

As the inventive concept allows for various changes and numerous embodiments, particular embodiments will be illustrated in the drawings and described in detail in the written description. The effect and features of the inventive concept and the method of realizing the effect and the features will be clear with reference to the exemplary embodiments described in detail below with reference to the drawings. However, the inventive concept may be embodied in various forms and should not be construed as being limited to the exemplary embodiments. As used herein, the term "and/or" includes any and all combinations of one or more of the associated listed items.

The exemplary embodiments of the present inventive concept will be described in detail with reference to the accompanying drawings. Like reference numerals in the drawings denote like elements, and thus their description will not be repeated.

It will be understood that when a layer, region, or component is referred to as being "formed on," another layer, region, or component, it can be directly or indirectly formed on the other layer, region, or component. That is, for example, intervening layers, regions, or components may be present. Sizes of elements in the drawings may be exaggerated for convenience of explanation. In other words, since sizes and thicknesses of components in the drawings are arbitrarily illustrated for convenience of explanation, the following embodiments are not limited thereto.

In the following examples, the x-axis, the y-axis, and the z-axis are not limited to the three orthogonal axes of a rectangular coordinate system and may be interpreted in a broader sense. For example, the x-axis, the y-axis, and the z-axis may represent different directions that are not perpendicular to one another.

FIG. 1 is a cross-sectional view schematically illustrating a portion of a display apparatus according to an exemplary embodiment. The display apparatus according to the present embodiment may include a substrate 100, a plurality of display devices, and color filters 210R, 210G, and 210B. The display devices illustrated in FIG. 1 are liquid crystal devices (LCDs).

The substrate 100 has a light-transmitting property and may be a glass substrate or a substrate that includes a polymer material such as polyimide. The plurality of display devices are disposed on the substrate 100. The display devices may be LCDs including liquid crystals 300 filled between pixel electrodes 120R, 120G, and 120B and a common electrode 230. The pixel electrodes 120R, 120G, and 120B and the common electrode 230 may also include light-transmitting materials, for example, ITO, IZO, ZnO, or $In_2O_3$, to have a light-transmitting property. Since thin film transistors (TFTs) may be electrically connected to the pixel electrodes 120R, 120G, and 120B, a TFT layer 110 may be disposed between the substrate 100 and the pixel electrodes 120R, 120G, and 120B. The display apparatus "appears" when images are displayed, and then "disappears" (or becomes substantially transparent) in the absence of images.

However, different from the embodiment illustrated in FIG. 1, various modifications are possible, for example, an alignment layer may be disposed on the pixel electrodes 120R, 120G, and 120B or the common electrode 230.

The color filters 210R, 210G, and 210B may be disposed to respectively correspond to the pixel electrodes 120R, 120G, and 120B. That is, a red color filter 210R may be disposed to correspond to the pixel electrode 120R of a red sub-pixel, a green color filter 210G may be disposed to correspond to the pixel electrode 120G of a green sub-pixel, and a blue color filter 210B may be disposed to correspond to the pixel electrode 120B of a blue sub-pixel. Accordingly, the display devices may be disposed between the substrate 100 and the color filters 210R, 210G, and 210B. The color filters 210R, 210G, and 210B may be disposed on an encapsulating substrate 200.

The color filters 210R, 210G, and 210B may transmit visible rays of a predefined wavelength band (e.g., pertaining to a certain color) only when ultraviolet (UV) rays are irradiated, and may transmit visible rays of a broader range when no UV rays are irradiated. That is, when no UV rays are received, the color filters 210R, 210G, and 210B may transmit visible rays that are outside the predefined wavelength band as well as visible rays that are in the predefined wavelength bands. The color filters 210R, 210G, and 210B may include a photochromic material, for example, BaMgSiO$_4$. Due to various metals such as Fe and/or Eu, BaMgSiO$_4$ may transmit visible rays in the predefined wavelength band only when UV rays are received by the color filters 210R, 210G, and 210B, and may transmit visible rays when no UV rays are received. Alternatively, various photochromic materials, which are formed by adding various functional groups to photochromic materials, for example, naphthopyran, spiro-oxazines, and/or chromene, may be used. Alternatively, photochromic materials sold by companies such as Nano Inc., QCR Solutions Corp., CTI, and LCR Hallcrest LLC may be used.

When the display apparatus according to the present embodiment displays an image, the color filters 210R, 210G, and 210B may be set to a mode for transmitting light in a predefined wavelength band. In detail, red light bandwidth may be transmitted at the red sub-pixel, green light bandwidth may be transmitted at the green sub-pixel, and blue light bandwidth may be transmitted at the blue sub-pixel so that a full color image may be displayed. When the display apparatus does not display an image, the color filters 210R, 210G, and 210B may transmit visible rays in most wavelength bands so that the display apparatus appears approximately transparent to the user.

As described above, since the color filters 210R, 210G, and 210B transmit visible rays in a predefined wavelength band only in response to irradiation by UV rays, a back light unit 400 that may irradiate UV rays onto the display devices may be further included. That is, the back light unit 400 may emit UV rays, the UV rays may penetrate through the display devices and reach the color filters 210R, 210G, and 210B, causing the color filters 210R, 210G, and 210B to transmit visible rays in the predefined wavelength band, and thus resulting in display of a full color image.

When the display devices are LCDs, certain pixels may not be able to transmit light according to electric signals applied to the pixel electrodes 120R, 120G, and 120B. In this case, UV rays emitted by the back light unit 400 may also not be able to penetrate through those certain pixels. Therefore, UV rays may not reach select color filters among the color filters 210R, 210G, and 210B that correspond to the certain pixels, and thus, these color filters may not be able to transmit light in the predefined wavelength band. However, since the certain pixels do not transmit light, light from a background of the display apparatus (−z direction) may not penetrate through the certain pixels. The presence of these non-transmissive pixels create contrast in an image, making the image clearer for the user.

The back light unit 400 capable of emitting UV rays may have a light-transmitting property so that the back of the display apparatus, in particular the physical area behind the back light unit 400, is visible through a transparent device. The back light unit 400 with the light-transmitting property may be formed by using, for example, organic light-emitting devices (OLEDs) with a light-transmitting property.

In the display apparatus including the LCDs such as the one described above, since the LCDs do not emit light, a visible light source may be required. Accordingly, the back light unit 400 may generate not only UV rays but also visible rays simultaneously as the UV rays onto the display devices through the substrate 100. That is, when the back light unit 400 simultaneously emits UV rays and visible rays, UV rays may reach the color filters 210R, 210G, and 210B, each of the color filters 210R, 210G, and 210B may transmit visible rays in a predefined wavelength band, and the transmission rate of the visible rays may be adjusted by the LCDs, causing the user to see a full color image.

As shown in FIG. 1, the display apparatus may further include a UV ray blocking layer 240. The UV ray blocking layer 240 may be located so that the color filters 210R, 210G, and 210B are interposed between the UV ray blocking layer 240 and the display devices.

The UV ray blocking layer 240 may block UV rays that are emitted from the back light unit 400 and passed through the color filters 210R, 210G, and 210B, to protect the user from unnecessary exposure to UV rays. Furthermore, the UV ray blocking layer 240 also blocks UV rays traveling in the opposite direction; namely, it may prevent UV rays from light sources other than the back light unit 400 from reaching the color filters 210R, 210G, and 210B and unintentionally putting the display device in the transparent mode when the back light unit 400 is not emitting UV rays. Furthermore, when UV rays from external light sources (for example, sunlight) are incident on the color filters 210R, 210G, and 210B, the color filters 210R, 210G, and 210B transmit visible rays in wavelength bands that are included within and outside the predefined wavelength band that is transmitted by the color filters. Alternatively, although not shown, the UV ray blocking layer 240 may be disposed on a surface of the back light unit 400 in an opposite direction with respect to the substrate 100 (the −z direction) to prevent UV rays of external light sources from being incident on the color filters 210R, 210G, and 210B through the back light unit 400 and the substrate 100.

The display apparatus may further include contrast increasing layers 220 between the color filters 210R, 210G, and 210B. The contrast increasing layers 220 may have a first light-transmission property upon receiving UV rays. The contrast increasing layers 220 have a second light-transmission property when UV rays are not received. The contrast increasing layers 220 transmit a greater amount of visible light with the second light-transmission property than with the first light-transmission property. In other words, more visible ray is transmitted when the contrast increasing layer 220 receive no UV rays than when they receive some UV rays. The contrast increasing layers 220 may be black, i.e., the light-transmission rate may be substantially 0 when UV rays are received. Since the display apparatus includes the contrast increasing layers 220 having different visible ray transmission rates in response to UV ray irradiation, a visible ray transmission rate of the entire display apparatus may be increased in the transparent mode, and the contrast increasing layers 220 may function as a black matrix between pixels or sub-pixels in a display mode. Thus, contrast may be increased. The contrast increasing layers 220 may include a photochromic material, for example, $BaMgSiO_4$. Various metals such as Fe and/or Eu, $BaMgSiO_4$ may transmit visible rays in the predefined wavelength band only when UV rays are received, and transmit visible rays of a broader bandwidth range when no UV rays are irradiated. Alternatively, various photochromic materials formed by adding various functional groups to photochromic materials, for example, naphthopyran, spirooxazines, and/or chromene, may be used. Alternatively, photochromic materials sold by companies such as Nano Inc., QCR Solutions Corp., CTI, and LCR Hallcrest LLC may be used.

Figure 2:
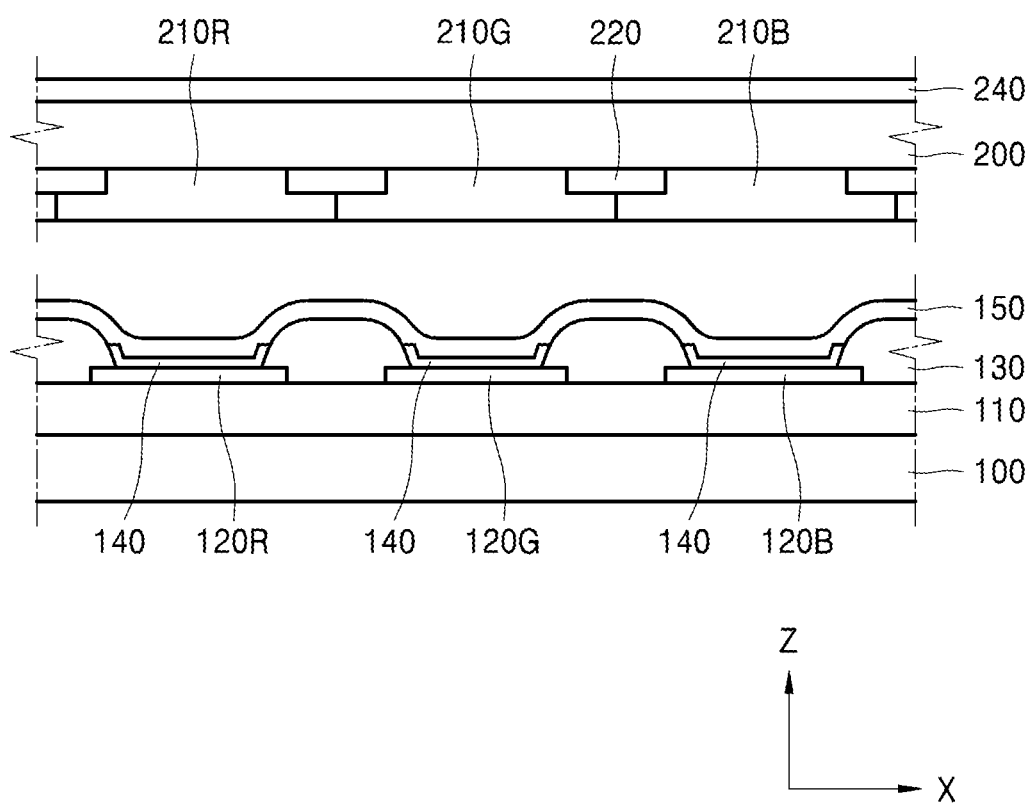
FIG. 2 is a cross-sectional view schematically illustrating a portion of a display apparatus according to another exemplary embodiment.

FIG. 2 is a cross-sectional view schematically illustrating a portion of a display apparatus according to another exemplary embodiment. The display apparatus according to the present embodiment may include a substrate 100, a plurality of display devices, and color filters 210R, 210G, and 210B. The display devices shown in FIG. 2 are OLEDs.

The substrate 100 has a light-transmitting property and may be a glass substrate or a substrate that includes a polymer material such as polyimide. The plurality of display devices are disposed on the substrate 100.

As shown in FIG. 2, the display devices may be OLEDs including intermediate layers 140 that include emission layers and disposed between the pixel electrodes 120R, 120G, and 120B and an opposite electrode 150. The pixel electrodes 120R, 120G, and 120B and the opposite electrode 150 may include light-transmitting materials, for example, ITO, IZO, ZnO, or $In_2O_3$, to have a light-transmitting property. The emission layers included in the intermediate layers 140 may emit white light, and a full color image is displayed as this white light penetrates through the color filters 210R, 210G, and 210B. If necessary, red light may be emitted from intermediate layers 140 of red sub-pixels, green light may be emitted from intermediate layers 140 of green sub-pixels, and blue light may be emitted from intermediate layers 140 of blue sub-pixels. In this case, as light in a certain wavelength band penetrates through the color filters 210R, 210G, and 210B, color purity of the light may be increased.

When the emission layers in the intermediate layers 140 emit white light, the intermediate layers 140 may not be patterned to correspond to the pixel electrodes 120R, 120G, and 120B as shown in FIG. 2, but formed as a single structure with respect to the pixel electrodes 120R, 120G, and 120B. When the emission layers in the intermediate layers 140 emit light in a predefined wavelength band according to the sub-pixels, at least the emission layers may be patterned to correspond to the pixel electrodes 120R, 120G, and 120B.

A pixel defining layer (PDL) 130 that covers edges of the pixel electrodes 120R, 120G, and 120B may be disposed such that it does not cover a central portion of each of the pixel electrodes 120R, 120G, and 120B. Since TFTs may be electrically connected to the pixel electrodes 120R, 120G, and 120B, the TFT layer 110 may be disposed between the substrate 100 and the pixel electrodes 120R, 120G, and 120B.

The color filters 210R, 210G, and 210B may be disposed to correspond to the pixel electrodes 120R, 120G, and 120B. That is, the red color filter 210R may be disposed to correspond to the pixel electrode 120R of the red sub-pixel, the green color filter 210G may be disposed to correspond to the pixel electrode 120G of the green sub-pixel, and the blue color filter 210B may be disposed to correspond to the pixel electrode 120B of the blue sub-pixel. Accordingly, the display devices may be disposed between the substrate 100 and the color filters 210R, 210G, and 210B. The color filters 210R, 210G, and 210B may be disposed on the encapsulating substrate 200.

The color filters 210R, 210G, and 210B may transmit visible rays in a predefined wavelength band only when UV rays are received and may transmit visible rays outside the predefined wavelength band as well as in the predefined wavelength band when no UV rays are received. That is, when no UV rays are received, the color filters 210R, 210G, and 210B may transmit visible rays in most wavelength bands. The color filters 210R, 210G, and 210B may include a photochromic material, for example, $BaMgSiO_4$. Various metals such as Fe and/or Eu, $BaMgSiO_4$ may transmit visible rays in the predefined wavelength band only when UV rays are received, and may transmit visible rays when no UV rays are received. Alternatively, various photochromic materials formed by adding various functional groups to photochromic materials, for example, naphthopyran, spirooxazines, and/or chromene, may be used. Alternatively, photochromic materials sold by companies such as Nano Inc., QCR Solutions Corp., CTI, and LCR Hallcrest LLC may be used.

When the display apparatus according to the present embodiment displays an image, the color filters 210R, 210G, and 210B may be set to a mode for transmitting light in the specified wavelength band. In detail, red light bandwidth may be transmitted at the red sub-pixel, green light bandwidth may be transmitted at the green sub-pixel, and blue light bandwidth may be transmitted at the blue sub-pixel so that a full color image may be displayed. When the display apparatus does not display an image, the color filters 210R, 210G, and 210B may transmit visible rays in most wavelength bands (both in and outside the specified wavelength band) so that the user may recognize the display apparatus as an approximately transparent state.

As described above, since the color filters 210R, 210G, and 210B transmit visible rays in the predefined wavelength band only when UV rays are received, the OLEDs may not only emit visible rays, but also simultaneously emit UV rays. That is, the OLEDs may emit UV rays, the emitted UV rays may reach the color filters 210R, 210G, and 210B causing the color filters 210R, 210G, and 210B to transmit visible rays in the predefined wavelength band, and thus a full color image may be displayed.

As shown in FIG. 2, the display apparatus may further include a UV ray blocking layer 240. The UV ray blocking layer 240 may be disposed so that the color filters 210R, 210G, and 210B are interposed between the UV ray blocking layers 240 and the display devices.

The UV ray blocking layer 240 may protect the user from UV rays that are emitted from the OLEDs and transmitted through the color filters 210R, 210G, and 210B by preventing the rays from reaching the user. Furthermore, the UV ray blocking layer 240 also blocks UV rays traveling in the opposite direction; namely, it may prevent UV rays from light sources other than the OLEDs from reaching the color filters 210R, 210G, and 210B and unintentionally putting the display device in the transparent mode when the back light unit 400 is not emitting UV rays. Furthermore, when UV rays from external light sources (for example, sunlight) are incident on the color filters 210R, 210G, and 210B, the color filters 210R, 210G, and 210B transmit visible rays in wavelength bands that do not overlap with the predefined wavelength band. Alternatively, although not shown, the UV ray blocking layer 240 may be disposed on a surface of the back light unit 400 in a direction opposite to a direction of the substrate 100 (the −z direction) to prevent UV rays of external light sources from being incident on the color filters 210R, 210G, and 210B through the substrate 100.

The display apparatus may further include the contrast increasing layers 220 between the color filters 210R, 210G, and 210B. The contrast increasing layers 220 may have a low light-transmission rate only when UV rays are irradiated. The contrast increasing layers 220 transmit more light when UV rays are not received than when UV rays are received. The contrast increasing layers 220 may be black, i.e., the light-transmission rate is substantially 0, when UV rays are received. Since the display apparatus includes the contrast increasing layers 220 having different visible ray transmission rates according to UV ray irradiation, a visible ray transmission rate of the entire display apparatus may be increased in the transparent mode, and the contrast increasing layers 220 may function as a black matrix between pixels or sub-pixels in a display mode. Thus, contrast may be increased. The contrast increasing layers 220 may include a photochromic material, for example, $BaMgSiO_4$. Various metals such as Fe and/or Eu, $BaMgSiO_4$ may transmit visible rays in the predefined wavelength band only when UV rays are received, and may transmit visible rays of a broader bandwidth range when no UV rays are received. Alternatively, various photochromic materials formed by adding various functional groups to photochromic materials, for example, naphthopyran, spiro-oxazines, and/or chromene, may be used. Alternatively, photochromic materials sold by companies such as Nano Inc., QCR Solutions Corp., CTI, and LCR Hallcrest LLC may be used.

Alternatively, the PDL 130 may perform the functions of the contrast increasing layers 220. For example, the PDL 130 may have a low light-transmission level only when UV rays are received and may have high light-transmission property when no UV rays are received, which indicates that the PDL 130 has a higher visible ray transmission rate than when UV rays are received. The PDL 130 may be black, i.e., the light-transmission rate is nearly 0, when UV rays are received. Since the display apparatus includes the PDL 130 that has different visible ray transmission level as a function of UV ray irradiation, a visible ray transmitting rate of the entire display apparatus may be increased in the transparent mode, and the PDL 130 may function as a black matrix between pixels or sub-pixels in a display mode. Thus, contrast may be increased.

As described above, according to the one or more of the above exemplary embodiments, a display apparatus may have an improved light-transmitting property in a transparent mode. However, the scope of the embodiments of the present inventive concept is not limited thereto.

It should be understood that the exemplary embodiments described herein should be considered in a descriptive sense only and not for purposes of limitation. Descriptions of features or aspects within each exemplary embodiment should typically be considered as available for other similar features or aspects in other exemplary embodiments.

While one or more exemplary embodiments have been described with reference to the figures, it will be understood by those of ordinary skill in the art that various changes in form and details may be made therein without departing from the spirit and scope as defined by the following claims.

What is claimed is:

1. A display apparatus comprising:
a substrate;
a plurality of display devices disposed on the substrate; and
color filters, wherein the plurality of display devices are interposed between the color filters and the substrate, the color filters configured to transmit visible rays only in a predefined wavelength band when ultraviolet (UV) rays are received, and configured to transmit visible rays when no UV rays are received,
a contrast increasing layer that is disposed where neighboring ones of the color filters meet, wherein the contrast increasing layer is configured to transmit a first amount of light only when UV rays are received, and is further configured to transmit a second amount of light when no UV rays are received, the second amount being greater than the first amount.

2. The display apparatus of claim 1, further comprising a back light unit configured to irradiate the plurality of display devices with UV rays.

3. The display apparatus of claim 2, wherein the back light unit is configured to simultaneously generate UV rays and visible rays and irradiate the plurality of display devices through the substrate.

4. The display apparatus of claim 2, wherein the back light unit has a light-transmitting property.

5. The display apparatus of claim 1, further comprising a UV ray blocking layer, wherein the color filters are interposed between the UV ray blocking layer and the plurality of display devices.

6. The display apparatus of claim 1, wherein the contrast increasing layer is configured to transmit substantially no light while receiving UV rays.

7. The display apparatus of claim 1, wherein the plurality of display devices include liquid crystal molecules.

8. The display apparatus of claim 1, wherein the plurality of display devices include organic light-emitting devices (OLEDs).

9. The display apparatus of claim 8, wherein the OLEDs are configured to simultaneously emit UV rays and visible rays.

10. A display apparatus comprising:
a substrate;
a plurality of display devices disposed on the substrate; and color filters, wherein the plurality of display devices are interposed between the color filters and the substrate, the color filters configured to transmit visible rays only in a predefined wavelength band when ultraviolet (UV) rays are received, and configured to transmit visible rays when no UV rays are received, wherein the plurality of display devices include organic light-emitting devices (OLEDs), wherein each of the OLEDs includes a pixel electrode, a pixel defining layer that covers an edge of the pixel electrode such that a central portion of the pixel electrode is exposed, an intermediate layer that includes an emission layer and is disposed on the pixel electrode, and an opposite electrode disposed on the intermediate layer, wherein the pixel defining layer has a low light-transmission rate only when UV rays are irradiated and a light-transmitting property when no UV rays are irradiated.

11. The display apparatus of claim 10, wherein the pixel defining layer is configured to transmit substantially no light while receiving UV rays.

* * * * *